United States Patent [19]

Wondra

[11] Patent Number: 4,573,036
[45] Date of Patent: Feb. 25, 1986

[54] INTEGRABLE CIRCUIT FOR DIGITAL-TO-ANALOG CONVERTER

[75] Inventor: Jürgen Wondra, Neubiberg, Fed. Rep. of Germany

[73] Assignee: Siemens Aktiengesellschaft, Berlin and Munich, Fed. Rep. of Germany

[21] Appl. No.: 448,221

[22] Filed: Dec. 9, 1982

[30] Foreign Application Priority Data

Dec. 10, 1981 [DE] Fed. Rep. of Germany ....... 3148956

[51] Int. Cl.$^4$ .............................................. H03M 1/00
[52] U.S. Cl. .......................... 340/347 DA; 340/347 M
[58] Field of Search ................... 340/347 DA, 347 M; 330/257, 288; 323/315; 307/297

[56] References Cited

U.S. PATENT DOCUMENTS

| | | | |
|---|---|---|---|
| 3,474,440 | 10/1969 | Schmid | 340/347 M |
| 3,961,326 | 6/1976 | Craven | 340/347 |
| 4,384,274 | 5/1983 | Mao | 340/347 DA |
| 4,408,190 | 10/1983 | Nagano | 340/347 DA |

FOREIGN PATENT DOCUMENTS 0762164  9/1980  U.S.S.R. ............... 340/347

OTHER PUBLICATIONS

RCA Technical Notes "Voltage Matching Circuit for Ladder Network" Oho Schade, Jr., Mar. 4, 1981.

Primary Examiner—Gary Chin
Attorney, Agent, or Firm—Herbert L. Lerner; Laurence A. Greenberg

[57] ABSTRACT

Integrable circuit for digital/analog converters wherein individual signal inputs addressed by part of a digital signal to be processed are connected to the same first terminal of a respective first diode, the first diode having a second terminal connected to the same terminal of a respective second diode and, furthermore, connected to an output of a transistor operated as a current source, the second diode of the diode pairs controlled by the individual signal inputs having a second terminal for jointly controlling an output amplifier, wherein the original current source transistors have respective current-carrying inputs addressed, via a respective resistor, by a common supply terminal, and wherein the individual diode pairs are mutually identical, and the current source transistors are of the same type, comprising at least one second current source transistor operatively associated with each of the first-mentioned current source transistors, both of said first mentioned and said second source transistors having current input electrodes, respectively, directly connected to one another, and current output electrodes of respective mutually associated pairs of said first-mentioned and said second current source transistors connected to a respective one of two identical digitally controlled circuit parts forming, together with resistances connected to said current input electrodes of the respective current source transistors, respective analog/digital converters.

10 Claims, 2 Drawing Figures

INTEGRABLE CIRCUIT FOR DIGITAL-TO-ANALOG CONVERTER

BACKGROUND AND FIELD OF THE INVENTION

The invention relates to an integrable circuit for digital/analog converters in which the individual signal inputs addressed by a respective part of the digital signal to be processed are connected to the same terminal of a respective first diode, and the second terminal of this first diode is connected to the same terminal of a respective second diode, and is in addition connected to the output of a respective transistor operated as a current source, while the other terminal of the second diode of the diode pairs controlled by the individual signal inputs is provided for the joint control of an output amplifier, in which furthermore the currentcarrying inputs of the individual current source transistors is addressed by a respective resistor from a common supply terminal, and in which, finally the individual diode pairs are equal to each other, and the current source transistors are of the same type.

RELATED ART

Digital/analog converters of this type are in common use and may be designed, for instance, in the manner seen in the book "Halbleiter-Schaltungstechnik" by Tietze and Schwenk (1980), pages 640 and 641. In the known design, the individual current source transistors are realized by jointly controlled bipolar transistors, which are connected to the cathodes of the two associated diodes. The anode of the first diode of the respective diode pair is connected to the corresponding input of the respective stage of the D/A converter, while the anode of the second diode, together with the anode of the respective second diode from the other stages of the D/A converter, are connected to the inverting input of an operational amplifier, provided with negative feedback by a resistor, namely, the output amplifier of the converter.

On the other hand, the current input electrodes, i.e. the emitters of the current source transistors, are connected via a respective resistor either directly to a supply terminal or, using a voltage divider, to the supply terminal. The last-indicated case prevails if the current source transistors are part of a conductor network, for instance an R-2R network.

The case occurs frequently that in an integrated circuit, two or more identical D/A converters are needed. There, it is considerably disadvantageous as far as the space requirement of the D/A converters on the chip as well as the manufacturing costs of the integrated circuit are involved, that each of these D/A converters must be provided with the resistors or the conductor network, respectively, which lead to the current input electrodes of the current source transistors. It would therefore be desirable if the cost connected therewith could be reduced.

It is accordingly an object of the invention to provide an integrable circuit for a digital-to-analog converter which avoids the foregoing disadvantage with respect to space requirement and which is economical to produce.

SUMMARY OF THE INVENTION

With the foregoing and other objects in view, there is provided, in accordance with the invention, an integrable circuit for digital/analog conversion wherein individual signal inputs are addressed by part of a digital signal to be processed and are connected to the first terminal of a respective first diode of a respective pair of diodes which include said first diodes and respective second diodes, and wherein second terminals of each diode pair are connected together and to an output of a respective first transistor operated as a current source, and wherein the first terminals of said second diodes are commonly connected for jointly controlling the inverting input of an output amplifier; and wherein the diodes in each diode pair are matched so that they are mutually identical; and wherein the current source transistors are of the same type and wherein each first transmitter is combined with at least one second current source transistor and wherein said first and second transistors have a common current input connected to a respective common resistor connected to a common current supply; and wherein the outputs of each of said first current transistors are connected to the common second terminals of said respective diode pairs of a first digital-to-analog converter while the outputs of each of said second current transistors are connected to the common second terminals of said respective diode pairs of a second digital-to-analog converter.

In accordance with another feature of the invention all of the current source transistors are supplemented by a further transistor to form current-mirror current sources.

In accordance with a further feature of the invention the current source transistors are bipolar transistors of given conductivity type, and other transistors of the circuit are bipolar transistors of opposite conductivity type.

In accordance with an added feature of the invention the given conductivity type is pnp.

In accordance with an additional feature of the invention the other transistors form an output amplifier of the circuit.

In accordance with again a further feature of the invention the respective current source transistors are connected to resistances forming a connection with another supply potential, the last-mentioned respective current source transistors being respectively formed of a transistor each with one emitter terminal and a plurality of collector terminals said plurality corresponding to the number of unitary digital-to-analog converters.

In accordance with again an added feature of the invention the diode pairs respectively acted upon by the current source transistors are formed as respective two-emitter transistor.

In accordance with yet another feature of the invention the two-emitter transistors are of a conduction type which is opposite to the conduction type of the current source transistors.

In accordance with again an additional feature of the invention the resistances forming a connection between the current source transistors and the other supply potential are supplemented by further resistors to form an R-2 R network.

In accordance with an additional feature of the invention the respective converters are connected to a common resistance network and have a respective operational amplifier with negative feedback as output amplifier.

In accordance with still a further feature of the invention the two circuit parts forming together with the common resistance network, a respective digital/analog converter comprise, as output amplifiers, a respective transistor connected as a current mirror and connected by the emitter thereof to reference e.g. ground potential, the respective transistor being of a conduction type opposite that of the current source transistors and having a collector connected via two additional transistors, connected as differential amplifiers and having a conduction type opposite that of the current source transistors, to another supply potential, one of the two additional transistors having a base acted upon by a reference voltage source and the other of the two additional transistors having a base acted upon, via an inverter, by a reversing signal supplied by a circuit part belonging to a digital control of the respective converter part.

In accordance with again an added feature of the invention, there is provided a respective inverter for digitally controlling individual signal inputs of the converters, the converters being mutually connected via the common resistance network.

In accordance with a concomitant feature of the invention the current input electrodes of the respective first-mentioned and second current source transistors are identical.

Describing an aspect of the invention in other words, two mutually identical digital/analog converters W1 and W2 jointly use the same resistances forming the connection between the current source transistors and the supply terminal furnishing the required supply potential. Therefore, only a single resistance combination, for instance only a single conductor network is required for the two D/A converters although the two D/A converters are addressed digitally completely independently of each other.

Other features which are considered as characteristic for the invention are set forth in the appended claims.

Although the invention is illustrated and described herein as embodied in an integrable circuit for digital-to-analog converter, is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

Figure 1:
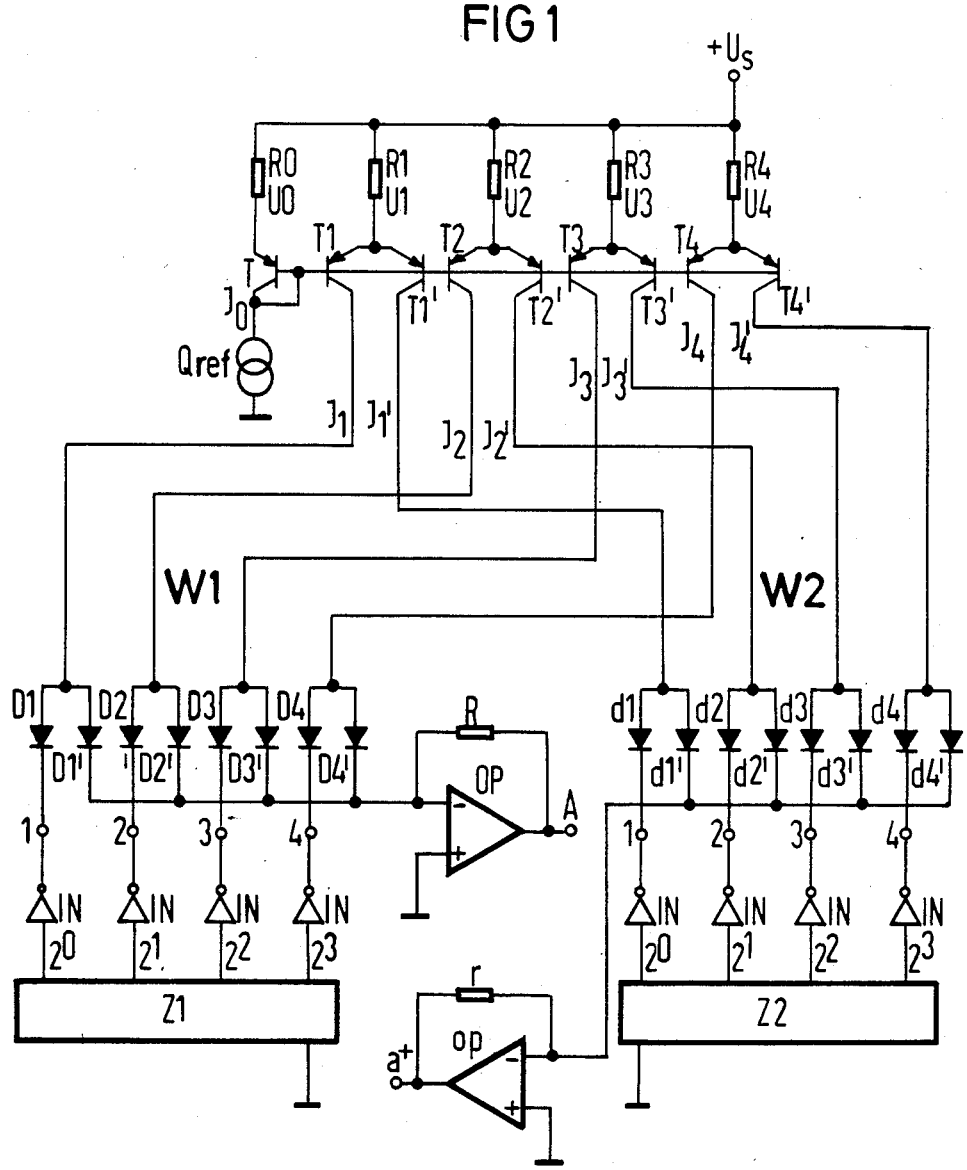
FIG. 1 is a circuit diagram of an embodiment of the integrable circuit for a digital-to-analog converter constructed in accordance with the invention.
Figure 2:
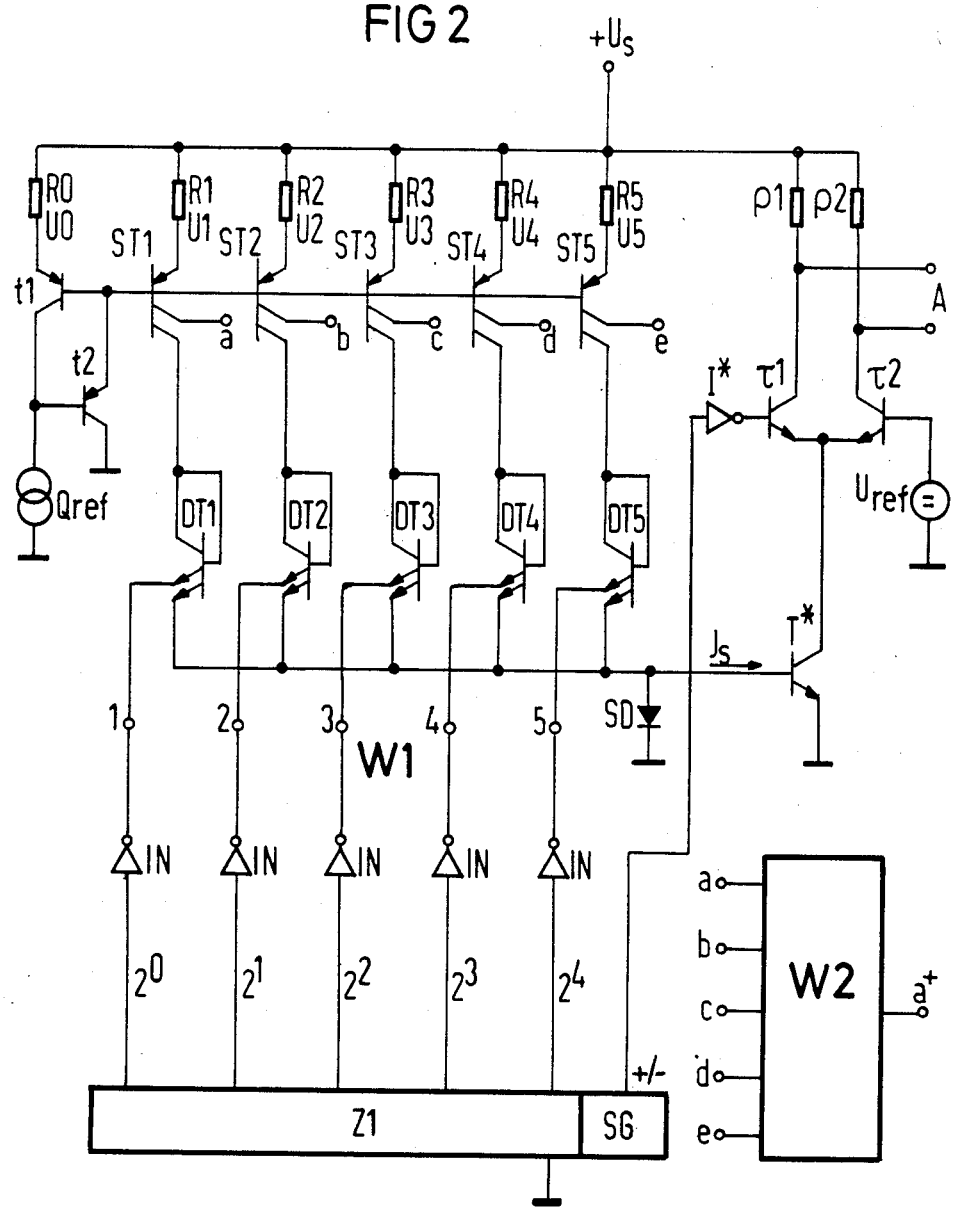
FIG. 2 is a circuit diagram of another embodiment of a digital-to-analog converter according to the invention.

Referring now more particularly to the drawing, it is noted that in the embodiment seen in FIG. 1, both converters W1 and W2 are shown in detail, while in FIG. 2 the one converter W2 is merely shown as a block with the exception of its current source transistors. It should further be noted that it is possible without difficulty for more than two converters to use a resistance combination jointly.

DESCRIPTION OF THE PREFERRED EMBODIMENTS

For driving the two converters W1 and W2, which in the example shown in FIG. 1 serve for processing digital words of four bits each, a digital circuit, for instance a binary digital counter Z1 and Z2, respectively, is provided, of which the outputs of the counter show the count forming one signal input for each of the respective converters W1 and W2 depending upon the respective bit value, using a respective inverter IN. These inputs 1, 2, 3, 4 are addressed in such a manner that the input 1 is given the MSB (most significant bit) signal and the input 4 the LSB (least significant bit) signal. Each of the inputs 1 and 4 is connected to a combination of two identical diodes which are identified in the case of the converter W1, by D1, D1', ... D4, D4' and, in the converter W2, by d1, d1', ... d4, d4'.

In accordance with the definition of the invention, the cathodes of the respective diodes, i.e. the diodes with the prime ("'") in the reference character of the mentioned diode pairs (i.e. the cathode of the diodes D1', D2', D3', D4', on the one hand, and d1', d2', d3', d4', on the other hand, respectively) are connected to the inverted input "−" of the operational amplifiers OP and op, respectively, assigned to the appertaining converters W1 and W2, respectively. The operational amplifiers OP and op, respectively, are provided with negative feedback by means of a resistor R and r, respectively, and form with their output A or a+, respectively, the output of the respective converter providing the desired analog signal.

In lieu of a counter Z1 or Z2, respectively, a series memory can also be used as the source for the digital signals of four bits each which are to be processed. The two converters W1 and W2 can also be addressed by different digital circuit parts.

The anodes of the pairwise mutually associated diodes D1, D1', ... D4 D4', and d1, d1', ... d4, d4' are always connected to each other and fed to the collector (i.e. the current output electrode) of a respective transistor, which is connected as a current source. In the first converter W1, these transistors are identified by reference characters T1 to T4 and in the second converter W2, by T1' to T4'.

The current source transistors T1 to T4 of the first converter W1 as well as the current source transistors T1' to T4' of the second converter W2 are all identical and, together with a common further transistor T connected as a diode, each forming a current mirror and thereby, a constant-current source. The transistor T connected as a diode is of the same type as the other current source transistors T1–T4 and T1'–T4', respectively. It is connected with its collector and its base to the reference potential of the circuit via a reference current source $Q_{ref}$. The reference current source $Q_{ref}$ furnishes a supply current which corresponds to the adjustment of the identical current source transistors and is furthermore determined by weighted resistors.

To this end, the emitter of each current source transistor T1–T4 of the first converter is connected, together with the emitter of the respective digitally corresponding current source transistor T1' to T4' of the second converter, to the other supply potential $+U_s$ via the corresponding resistors R1, R2 or R3, R4, respectively weighted in accordance with the respective digital value.

It is advisable that the transistors provided in the usual manner in the output amplifiers OP and op, respectively, of the two converters W1 and W2 are of the npn-type and the current source transistors are of the pnp-type and that in this connection the switching diodes D1–D4 or D1'–D4' or d1–d4 and d1'–d4' are then connected with their p-conduction zone to the collector of the corresponding current source transistor. Obviously, this is also the case in the embodiment according to FIG. 2. It should further be mentioned that the transistor T, connected as a diode may be connected in the current mirror optionally via a resistor $R_o$ to the other suppy potential $+U_s$.

Finally, it will be understood that, with a corresponding choice of the reference potential and the other supply potential, the current source transistors T, T1, T1' etc. can also be realized by npn-transistors. Then, the remaining transistors of the circuit, i.e. the transistors in the output amplifiers OP, op and the transistors in the circuit parts IN, Z1 and Z2 will be realized as pnp-transistors. The version shown in FIGS. 1 and 2, however, appears to be more advantageous in the interest of a faster response of the converters W1 and W2. Finally, still further converters W3 etc. may be provided, which are then designed in the same manner as the converters W1 and W2, and are connected to the common resistance combination R1 . . . R4, each using a current source transistor identical with the other current source transistors.

The embodiment of a D/A converter circuit according to the invention, shown in FIG. 2 differs from the embodiment according to FIG. 1 primarily in that the diode pairs first and second diodes, respectively, D1, D1', . . . D4, D4', D5, D5' (the individual converters W1 and W2 have 5 individual inputs each in the embodiment example shown in FIG. 2, and furthermore only the converter W 1 is shown in detail, as noted already above) are realized by an npn-transistor DT1, DT2 or DT3, DT4 or DT5 each having two emitters, as well as the current source transistors belonging to the individual converters W1, W2 are combined in one transistor each.

For realizing the diode pairs in the individual converters, a two-emitter npn-transistor DT1. . . DT5 is provided per diode pair, where the one emitter of these transistors is connected to the corresponding signal input 1–5 of the respective converter W1 and W2, and the other emitter to the common input of the output amplifier AV. This input is realized in the case of the example shown in FIG. 2 by the base of an npn-transistor T* connected as a constant current source, which is furthermore connected via a summing diode SD (for instance, realized likewise by an npn-transistor), to the anode of which it is connected, to reference potential (ground) of the circuit. The emitter of this npn-transistor T*, operated as a constant-current source, is likewise connected to reference potential, while its collector is tied to the emitter of two npn-transistors $\tau 1$ and $\tau 2$ connected to each other as a differential amplifier, in the usual manner. The collectors of these two last-mentioned npn-transistorss $\tau 1$ and $\tau 2$ form the two output terminals A of an output amplifier and are further connected via resistors Q1 and Q2, respectively to the other supply potential $+U_s$. The one signal input of the differential amplifier, i.e., the base of the transistor $\tau 1$, is connected via an inverter I* to a reversing signal "+/−" which ensures taking a sign into consideration, while the input realized by the base of the transistor $\tau 2$ is driven by a d-c reference voltage source $U_{ref}$ referred to the reference potential.

Essential for the invention, however, is above all the design, seen in FIG. 2, of the pnp-current source transistors which are associated with each other by the two converters W1 and W2 and each connected via a common resistor R1, . . . R5 to the other supply potential $+U_s$, in that these are combined in one each two-collector pnp-transistor ST1 to ST5. The one collector of these transistors ST1 to ST5 is connected to the base and to the collector of the respective corresponding two-emitter npn-transistor DT1, . . . DT5 of the first converter W1 and the second collector to the base and the collector of the respective corresponding two-emitter npn-transistor in the second converter W2. Since for space reasons, only the converter W1 is shown in detail in the drawing and only a block is shown for the second converter, the mentioned terminals of the two-emitter transistors of the second converter are indicated only by a letter a, . . . e each, without being shown themselves.

Via their base terminals, the said two-collector pnp-transistors ST1 to ST5 are connected to the base of a further pnp-transistor t1 as well as to the emitter of a second further pnp-transistor t2, where the base-collector path of the transistor t1 is shunted by the emitter-base path of the transistor t2, and the emitter of this transistor t1 is connected via a resistor $R_o$ to the other supply potential $+U_s$. The collector of the transistor t1 is connected to reference potential, and the base of t2 as well as the collector of the pnp-transistor t1 are connected likewise to reference potential via the reference current source $Q_{ref}$. In this manner, an improvement of the current source transistors is achieved as compared to the simpler circuit according to FIG. 1.

As already stated, the resistors $R_i$, which are associated with the individual current source transistor pairs $T_i$ and $T_i'$ and $ST_i$ are weighted digitally, and specifically in such a manner that the current $J_i$ transmitted by the current source transistor $T_i$ and $T_i'$ or $ST_i$ of the i-th stage of the respective converter to the corresponding diode pair $D_i$, $D_i'$ or $D_i$, $D_i'$ or the two-emitter transistor $ST_i$ replacing this diode pair, fulfills the condition $J_i$=-constant $\cdot 2^{(i-1)}$, where i=1, 2, . . . n, and n is the total number of digital stages provided in each of the two converters W1 and W2. The input bit of the respective stage has the significance $2^{(i-1)}$. In the embodiment example shown in FIG. 1, n is =4 and in the example according to FIG. 2, n=5.

In the examples of a D/A converter circuit according to FIGS. 1 and 2, a current $J_i$ and $J_i'$ stemming from a current mirror circuit with the output transistors $T_i$, $T_i'$ and $ST_i$ respectively, is passed to the reversing switches realized by the diode pairs or the transistors $DT_i$ of the individual stages i of the D/A converter, where the weighting of these currents $J_i$ (or $J_i'$, respectively) is accomplished in accordance with the formula $J_i$=constant $\cdot 2^{(i-1)}$ via the resistors $R_o$ and $R_i$. The reference current source $Q_{ref}$ generates at the resistor $R_o$ (which connects the emitter of the pnp-transistor T or t1, connected as a diode, to the other supply potential $+U_s$) a voltage drop $U_o = R_o \cdot J_{ref}$. At the resistors $R_i$, i.e., the resistors R1, R2, . . . etc., the same voltage $U_1 = U_2 = \ldots = U_n$ adjusts itself if care is taken that the threshold difference caused by the different current values in the transistors $T_o$ and $T_i$ can be ignored. This can be achieved, for instance, by corresponding by matching the transistor areas in the integrated circuit or also by taking care that the voltage drop at the emitter resistor $R_o$ of the transistor T (or t1 and t2) connected as a diode in the current mirror is considerably larger than the threshold voltage of the current source transistors $T_i$ and $ST_i$. By correspondingly adjusting the resistance values of the resistors $R_i$, the currents $J_i$ and $J_i'$, supplied by the collectors of the current source transistors $T_i$ and $T_i'$ or $ST_i$, respectively, can be adjusted.

In view of FIG. 2, attention should further be directed toward the following, in connection with the differential amplifiers $\tau_1$ and $\tau_2$ which is controlled by the current source transistor T* by the summing diode SD and the entirety of the two-emitter transistors $DT_i$. Driving the already mentioned inverter I* by a circuit part SG of a digital equipment Z1 or Z2, respectively, serving for the digital drive of one each of the provided converters W1 and W2 by a signal "+/−" makes it possible to increase the converter capacity over the number of stages i of the converters W1 and W2 by one bit each. Here, the principle of the height/depth adjustment is used which is customary in audio technology.

In the examples shown in FIGS. 1 and 2, only two identical converters each are connected to a common resistance network $R_i$ with binary weighting. However, also more than two identical converters can be connected to the common resistance network $R_i$ in an identical manner. If the number of identical D/A converters is equal to m, either m identical current source transistors according to the transistors $T_i$, $T_i'$ are connected with their collectors to the respectively corresponding converter in the manner already described and are connected jointly with their emitters to the corresponding resistor $R_i$ and therefore, to the other supply potential $+U_s$. Or one uses as current source transistors n identical m-collector transistors $ST_i$ of the pnp-type, the emitters of which are connected in the manner seen in FIG. 2 to the corresponding resistor $R_i$, and the bases of which are controlled jointly by the pnp-transistor T connected as a diode. The m collectors of each of these transistors $ST_i$ are then connected to the corresponding diode pair of each of the provided converters or the corresponding two-emitter npn-transistor $DT_i$ which replaces this diode pair, in the manner seen in FIG. 1 or FIG. 2.

Under the assumption that the weighting of the currents $J_i$ furnished by the current source transistors $T_i$, $T_i'$ or $ST_i$ is determined exclusively by the corresponding resistor $R_i$ or by connecting to an R-2R network, the relation applies for the current $J_i$:

$$J_i = J_{ref} \cdot R_o / m \cdot R_i.$$

If then the input 1 carries the LSB signal, and the input n (in the example according to FIG. 1, n=4, in the example according to FIG. 2, n=5; however n can also have any other integral value) the MSB signal, as is given expression also in the two Figures, then the resistance of the MSB stage, i.e. the resistance $R_n$ has the value $R_o/2$, the resistance $R_{n-1}$ in the stage (n−1), the value $R_o$ etc. In general the relation applies for the design of the resistance $R_i$ $$R_i = R_o \cdot 2^{(n-i-1)},$$

where i may be 1, 2, ... n.

The currents $J_i$ flow through the corresponding decoupling diodes $D_i$ and $D_i'$, respectively, which can be realized, as shown in FIG. 2, as npn-transistors with double emitter, either to the corresponding digital input i and therefore into the driving gates IN from the digital part addressing the respective converters W1 or W2, or into the summing diode SD. The current $J_s$ then arriving at the summing diode SD is taken via a current mirror transistor T* and can be switched over if required via the differential stage formed by the transistors $\tau_1$ and $\tau_2$, depending on a sign bit supplied via the inverter I*.

In lieu of the weighted resistances $R_i$, an R-2R network can be used as the resistance network for obtaining the weighted currents $J_i$ from the individual current source transistors $T_i$ or $T_i'$ or $ST_i$, respectively, which network is connected in the usual manner to the emitters of the current source transistors belonging to the stage i. This now means that the potential $+U_s$ is applied to one end of a voltage divider consisting of n equal resistors R; this voltage divider is connected via a further resistor 2R to reference potential. From the individual divider points of this voltage divider starts a current which is conducted via one resistor 2R each and serves for driving the emitters or emitter of the corresponding current source transistor. The desired weighting is then provided automatically as is well known.

For a monolithic realization of the circuit according to the invention it is advisable to realize the systems Z1, Z2 which furnish the digital signals to be processed, as well as the inverters IN preceding as buffers the inputs to be driven of the two converters W1 and W2, in I²L technology. However, other logic system can also be used. Also the use of bipolar transistors is not mandatory. Thus, the transistors given in FIGS. 1 and 2 can be replaced directly by self-blocking MOS field-effect transistors and the current source transistors can be realized by p-channel transistors and the other transistors by n-channel transistors. It is directly possible to assign to one gate electrode several source or drain zones, and to create in this manner a parallel embodiment to the multi-emitter or multi-collector transistors.

I claim:

1. In an integrable digital/analog converter arrangement including at least two digital/analog converter circuits each including:
    a plurality of inputs for a digital input signal to be converted into an analog output signal, said inputs corresponding in number to the number of bits of said digital input signal,
    a plurality of first diodes each connected with a first terminal to a corresponding one of said inputs,
    an equal plurality of second diodes which are mutually identical with said first diodes, a second terminal of each of said first diodes being connected to a second terminal of
    a corresponding one of said second diodes and the first terminals of said second diodes being commonly connected to
    an input of an output amplifier for providing said analog output signal, and
    a plurality of digitally weighted current sources each comprising a current source transistor, said transistors all being of the same type, and a plurality of resistors each having first and second terminals, wherein current input terminal of each one of said current source transistors are respectively connected to the first terminal of the corresponding one of said resistors, the second terminals of said resistors being commonly connected to a common power supply terminal, and the current output terminals of said current source transistors being connected to corresponding second terminals of said first diodes and to corresponding second terminals of said second diodes,
the improvement comprising that
said current input terminals of the corresponding current source transistors of said at least two digital/analog converter circuits are commonly connected to said power supply terminal via a corresponding one of said resistors.

2. Integrable digital/analog converter arrangement according to claim 1 comprising a further transistor having its base commonly connected to the bases of said plurality of current source transistors to form current mirror current sources.

3. Integrable digital/analog converter arrangement according to claim 1 wherein said current source transistors comprising bipolar transistors each having a base, an emitter, and a plurality of collectors wherein the number of said collectors corresponds to the number of said digital/analog converter circuits and wherein said emitters of said bipolar transistors are coupled by said resistors to said common power supply terminals and wherein said collectors of said bipolar transistors are coupled to said commonly connected first terminals of said first and second diodes of corresponding digital/analog converter circuits.

4. Integrable digital/analog converter arrangement according to claim 3, wherein said first and second diodes comprise bipolar transistors each having a base, a collector and two emitters and wherein said base and said collector are directly connected and wherein said emitter forms said second terminals of said first and second diodes, respectively.

5. Integrable digital/analog converter arrangement according to claim 1 wherein said output amplifier comprises an operational amplifier.

6. Integrable digital/analog converter arrangement according to claim 4 wherein said two-emitter transistor is of a conductivity type opposite to the conductivity type of said current source transistors.

7. Integrable digital/analog converter arrangement according to claim 3 wherein said resistors connecting said current source transistors and said common supply potential form an R-2R network.

8. Integrable digital/analog converter arrangement according to claim 1 wherein each of the respective converters are connected to a respective operational amplifier with negative feedback serving as said output amplifier.

9. Integrable digital/analog converter arrangement according to claim 7 including a respective inverter for digitally controlling individual sign inputs of said converters, said converters being mutually connected via said R-2R network.

10. Integrable digital/analog converter arrangement according to claim 1 wherein the current input terminals of the current source transistors respective of each converter are commonly connected.

* * * * *